March 10, 1970 YING-CHEN HWANG 3,500,075
BIPOLAR PULSE GENERATING CIRCUITS
Filed Nov. 2, 1966

INVENTOR:
YING-CHEN HWANG,
BY [signature]
HIS ATTORNEY.

United States Patent Office 3,500,075

Patented Mar. 10, 1970

3,500,075
BIPOLAR PULSE GENERATING CIRCUITS

Ying-Chen Hwang, Liverpool, N.Y., assignor to General Electric Company, a corporation of New York Filed Nov. 2, 1966, Ser. No. 591,484
Int. Cl. H03k 3/26
U.S. Cl. 307—319 7 Claims

ABSTRACT OF THE DISCLOSURE

A bipolar pulse generator employing a single charge storage diode, a backward bias means normally applied to said diode and means for applying a unipolar pulse for overcoming said backward bias and causing brief forward conduction and upon termination brief conduction in the backward direction. The pulse width is made appreciably less than the diode's minority carrier lifetime in order that a symmetrical bipolar pulse may be generated.

The invention relates in general to bipolar pulse generating circuits and, in particular, to circuits of this type for generating narrow width pulses, which employ a single charge storage diode, also referred to as snap-off diodes or step recovery diodes, in a unique and relatively simple circuit configuration.

Bipolar pulses having zero D.C. component may be used to advantage in numerous applications for which unipolar pulses are presently employed. The absence of D.C. component makes the bipolar pulse more compatible with A.C. circuitry than unipolar pulses. Thus, they readily pass through A.C. networks without introducing repetition rate frequency sensitivity. In addition, bipolar pulses have been advantageously employed for nondestructive readout of magnetic thin film storage structures.

Whereas many unipolar pulse generating circuits are known, a number of which employ charge storage diodes for providing narrow width, sharp edged pulses, until the present invention there has not been developed a simply constructed, inexpensive bipolar pulse generating circuit.

It is accordingly an object of the invention to provide a novel bipolar pulse generating circuit which is of simple circuit configuration and may be inexpensively fabricated.

It is another object of the invention to provide a novel bipolar pulse generating circuit as above described which employs a single charge storage diode.

A further object of the invention is to provide a novel bipolar pulse generating circuit as described which generates short duration bipolar pulses of a substantially symmetrical shape.

These and other objects of the invention are accomplished in a circuit employing a single charge storage diode having a given minority carrier lifetime, connected in series with a load across which the bipolar pulse is to be generated. A reverse D.C. bias is applied to said diode to place the diode in a normally high impedance state. A unipolar pulse is further applied to said diode through a D.C. isolating means, said pulse having a polarity opposite to that of the D.C. voltage source and a peak amplitude exceeding that of said D.C. voltage source so as to overcome said reverse bias and cause said diode to briefly conduct in the forward direction. By making the forward conduction time appreciably less than the minority carrier lifetime of the diode, a bipolar pulse will be generated at the output, the positive and negative portions of which have equal current-time areas. This is accomplished primarily by supplying a unipolar pulse of appropriate pulse width and shape. Accordingly, in response to said unipolar pulse, the diode conducts for a short time in the forward direction, during which time charged is stored, and then briefly conducts in the backward direction as the stored charge is swept out. The reverse conduction time may be made approximately equal to the forward conduction time by adjusting the D.C. bias with relation to the unipolar pulse amplitude, so as to generate a bipolar pulse of a generally symmetrical configuration.

The specification concludes with claims particularly pointing out and distinctly claiming the subject matter which is regarded as the invention. It is believed, however, that both as to its organization and method of operation, together with further objects and advantages thereof, the invention may be best understood from the following description taken in connection with the accompanying drawings in which:

Figure 1:
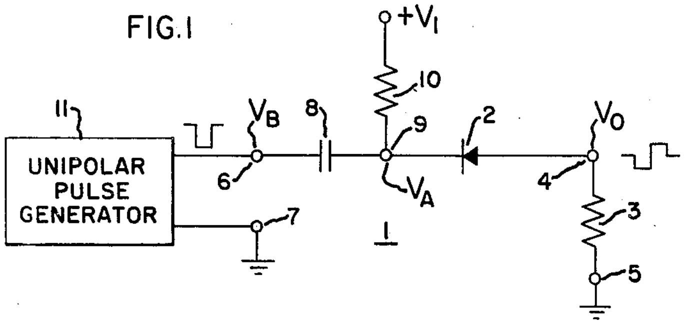
FIGURE 1 is a schematic diagram of one embodiment of the invention.

With reference now to FIGURE 1, there is illustrated in accordance with one exemplary embodiment of the invention, a bipolar pulse generating circuit 1 which includes a charge storage diode 2 for forming a narrow width bipolar pulse across a load impedance 3, extending between output terminals 4 and 5, in response to a unipolar pulse applied to terminals 6 and 7. The charge storage diode 2 is connected to terminal 6 through a D.C. isolating capacitor 8. The cathode of diode 2 is joined to the capacitor 8 at an intermediate terminal 9, and the anode is connected to the load impedance 3 at terminal 4. Terminals 5 and 7 are at ground. A D.C. voltage source $+V_1$ is connected through a bias resistor 10 to terminal 9 for supplying a reverse bias voltage to the diode 2.

The charge storage diode 2 is a well known semiconductor device which exhibits characteristics of charge storage and abrupt switching from its low impedance to its high impedance state. It is constructed so as to have a predetermined minority carrier lifetime $\tau$, e.g., on the order of 10 to 100 nanoseconds. The definition of the minority carrier lifetime $\tau$ can be obtained from the expression:

$$Q_t = Q_1 \cdot e - \frac{t}{\tau} \qquad (1)$$

where $Q_1$ is the initial stored charge, $Q_t$ is the charge remaining at a given time as the result of recombination effects. In accordance with the expression 1 when $t=\tau$, $Q_\tau = Q_1/e$. Thus, the minority carrier lifetime $\tau$ may be said to be the time it takes for a quantity of stored a charge $Q_1$ to decay to value of $Q_1/e$.

A pulse generator 11, shown in block form and which may itself be a conventional component, is connected to terminals 6 and 7, and generates a narrow unipolar pulse of opposite polarity to and of greater magnitude than the voltage source $+V_1$ so as to overcome the D.C. bias level and provide forward current conduction through the diode. The width and shape of the applied pulse is adjusted so that, in combination with the D.C. bias magnitude, the forward conduction time is appreciably less than the minority carrier lifetime of the charge storage diode. For an applied unipolar pulse of generally square configuration, as illustrated in graph *a* of FIGURE 2, the forward conduction time is approximately equal to the pulse width, and is typically one-fifth to one-tenth of the carrier lifetime.

The stored charge in the diode 2 may be expressed as follows:

$$Q_1 = \int_{t_0}^{t_1} i dt \quad (2)$$

where $t_1 - t_0 << \tau$. As will be further explained, the charge $Q_1$ is stored by application of the unipolar pulse and is swept out during and after termination of the pulse.

In the operation of the circuit, the charge storage diode 2 is initially reverse biased into its high impedance state by voltage source $+V_1$. For this condition the voltage $V_A$ between terminal 9 and ground is approximately equal to $V_1$, as shown in graph *b* of FIGURE 2. It may be appreciated that this voltage is in essence entirely across the diode 2 so that at this time the output voltage $V_0$ between terminal 4 and ground is essentially zero, as shown in graph *c* of FIGURE 2.

Figure 2:
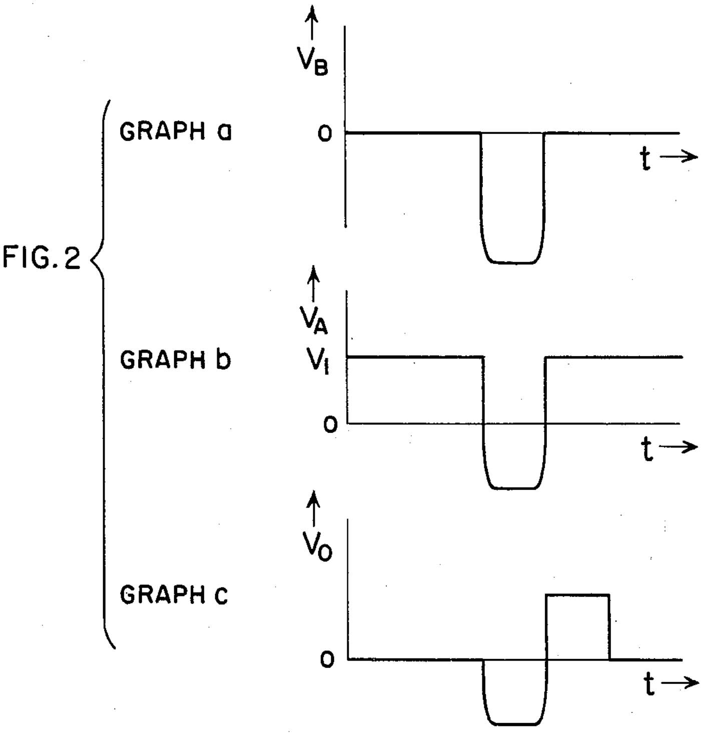
FIGURE 2 is a graph of various waveforms employed in description of the operation of FIGURE 1.

In response to the application of a negative unipolar pulse of voltage $V_B$ between terminal 6 and ground, as shown in graph *a* of FIGURE 2, the voltage $V_A$ correspondingly falls in the negative direction in accordance with the applied voltage waveform. When the voltage $V_A$ falls below ground level, diode 2 commences to conduct in the forward direction in its low impedance state. With diode 2 in the low impedance state the output voltage $V_0$ which was previously at about ground level, becomes negative in accordance with the applied voltage waveform. Upon the applied pulse being terminated, the voltage $V_A$ rises above ground and the diode 2 becomes reverse biased. However, for the initial reverse conduction, the diode remains in its low impedance state so that the output voltage continues to follow the applied voltage and $V_0$ also rises above ground. Upon all of the stored charge in diode 2 being swept out, the diode suddenly snaps to its high impedance state, and in accordance with this snap, the output voltage abruptly returns to its steady state ground level. There is accordingly generated, as shown in graph *c*, an essentially symmetrical bipolar pulse, the amplitude of which is equal to a clipped portion of the applied pulse, as determined by the magnitude of the bias voltage.

In a typical operable embodiment of the invention being considered, the following circuit components and values, presented for purposes of illustration and not to be construed as limiting, may be employed:

| | |
|---|---|
| Resistor **3** | 50 ohms. |
| Resistor **10** | 1K ohm. |
| Capacitor **8** | .01$\mu$ farads. |
| Diode **2** | Hewlett Packard Associates 0114. |
| Voltage source $V_1$ | 7.5 volts. |
| Pulse generator II | E–H Research Lab, Oakland, Calif. Model 123A, generating exemplary pulse of 15 volts peak amplitude, 20 nanosecond pulse width, <7 nanosecond rise time. |

To generate a symmetrical pulse, the leading edge of the applied unipolar pulse should have a rise time comparable to the snap time of the diode. As a further consideration, in order to provide symmetry the D.C. bias level must be properly adjusted with respect to the pulse peak amplitude. For example, when considering unipolar pulses of generally square configuration, the applied pulse must have a peak amplitude twice that of the voltage source $V_1$. For pulses of triangular shape, the applied pulse should have a peak amplitude no greater than twice that of source $V_1$. It may be appreciated that for many applications only an approximately symmetrical pulse need be provided in which case the applied pulse leading edge rise time may be appreciably greater than the diode snap time, e.g., in the form of half a sine wave, and the magnitude of the applied pulse somewhat more or less than twice the voltage source magnitude. In each instance, however, the forward conduction time must be appreciably less than the minority carrier lifetime of the diode so that the current-time area of both halves of the generated bipolar pulse are approximately equal.

Figure 3:
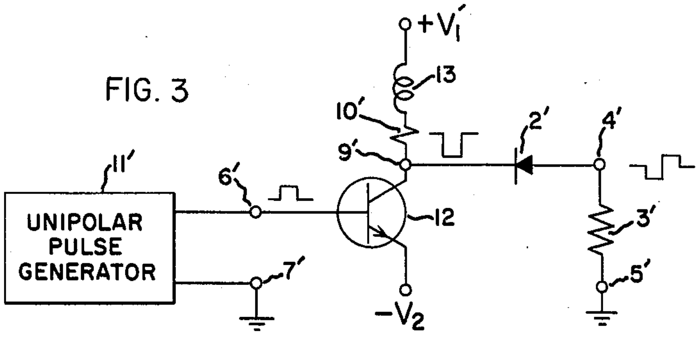
FIGURE 3 is a schematic diagram of a second embodiment of the invention.

In a second embodiment of the invention shown in FIGURE 3, a transistor 12 provides the D.C. isolation between the pulse generator 11′ and the charge storage diode 2′, as well as supplying amplification of the applied unipolar pulse. The base electrode of transistor 12 is connected to terminal 6′; the collector is connected through resistor 10′ and an inductor 13 to source $V'_1$; and the emitter is connected to a D.C. voltage source $-V_2$. The inductor 13 provides efficient current conduction through the transistor 12 with the diode 2′ in the low impedance state. The remaining components may be similar to those in FIGURE 1 and are similarly identified but with an added prime rotation. The operation of the circuit is essentially the same as described with respect to FIGURE 1. However, it is noted that the constraints applicable to the applied pulse in the circuit of FIGURE 1 apply to the amplified pulse in the instant circuit.

What I claim as new and desire to secure by Letters Patent of the United States is:

1. A bipolar pulse generator, comprising:

(a) a semiconductor diode exhibiting characteristics of charge storage and abrupt switching from its low impedance to its high impedance state and constructed to have a minority carrier lifetime, (b) a load impedance coupled to the output side of said diode, (c) input means including reverse bias means coupled to said diode in its nonconducting, high impedance state, (d) said input means further including first means for generating a unipolar pulse having a pulse width appreciably less than said carrier lifetime, and (e) second means for applying said pulse to the input side of said diode so as to overcome said reverse bias and cause said diode to briefly conduct in the forward direction for a time appreciably less than said carrier lifetime, whereby a bipolar pulse is generated across said load impedance.

2. A bipolar pulse generator as in claim 1 wherein said second means includes a D.C. isolating component.

3. A bipolar pulse generator as in claim 2 wherein said reverse bias means includes a D.C. voltage source connected through a bias resistor to the input side of said diode, said applied unipolar pulse having a polarity opposite to and a peak amplitude exceeding that of said voltage source.

4. A bipolar pulse generator as in claim 3 wherein said D.C. isolating component is a capacitor for readily passing the applied unipolar pulse, said capacitor and said diode being serially connected in the order recited between said first means and said load impedance.

5. A bipolar pulse generator as in claim 3 wherein said D.C. isolating component is a transistor, the input electrode of which is coupled to said first means and the output electrode of which is coupled to the input side of said diode.

6. A bipolar pulse generator as in claim 3 wherein said diode has a minority carrier lifetime on the order or 10 to 100 nanoseconds and said unipolar pulse has a pulse width of one-fifth to one-tenth said carrier lifetime.

7. A bipolar pulse generator as in claim 6 wherein said first means generates a unipolar pulse having a rise time on the order of the time for said diode to switch to its high impedance state, and a peak amplitude no more than twice that of said voltage source.

References Cited

UNITED STATES PATENTS 2,737,601 3/1956 McMahon ---------- 307—281

(Other references on following page)

OTHER REFERENCES

Step Recovery Diode by G. Wheeler, Solid State Design, February 1963, pp. 20 and 21.

Understanding Snap Diodes by J. Giorgis, reprint from November 1963 issue of E.E.E., 4 unnumbered pages first, and Fig. 9, made of record.

JOHN S. HEYMAN, Primary Examiner

B. P. DAVIS, Assistant Examiner

U.S. Cl. X.R.

307—260, 300